Figure 1:
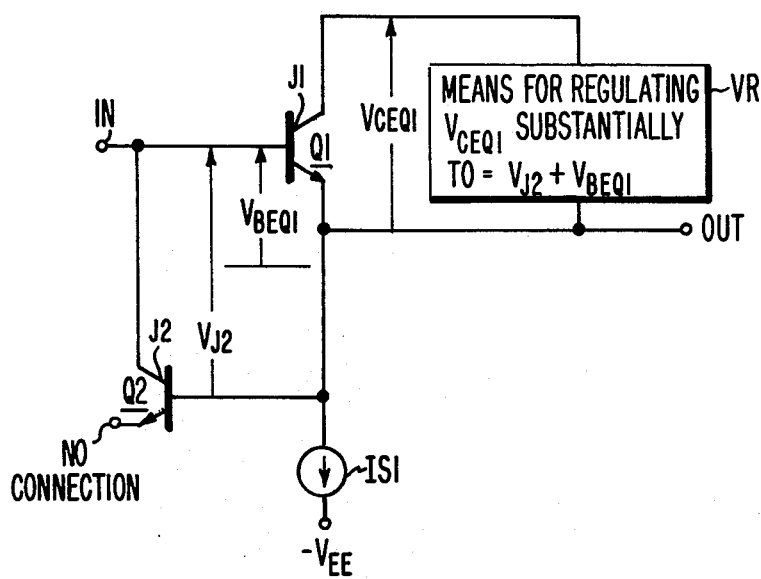

United States Patent [19]

Robe

[11] 4,151,483
[45] Apr. 24, 1979

[54] RADIATION-HARDENED TRANSISTOR AMPLIFIERS

[75] Inventor: Thomas J. Robe, Bridgewater Township, Somerset County, N.J.

[73] Assignee: RCA Corporation, New York, N.Y.

[21] Appl. No.: 878,993

[22] Filed: Feb. 17, 1978

[51] Int. Cl.² ............................................. H03F 3/08
[52] U.S. Cl. .................................. 330/308; 307/308; 330/261; 330/296
[58] Field of Search ................ 307/308; 330/252, 308, 330/261, 296

[56] References Cited
U.S. PATENT DOCUMENTS 3,743,955   7/1973   Stehlin .............................. 330/308 X

*Primary Examiner*—Lawrence J. Dahl
*Attorney, Agent, or Firm*—H. Christoffersen; A. L. Limberg; E. P. Herrmann

[57] ABSTRACT

The transient photo-currents generated in the collector-base junction of an amplifier transistor responsive to transient ionizing radiation are counteracted by those similarly generated in an auxiliary p-n semiconductor junction in inverse-parallel connection with the emitter base junction of the amplifier transistor. To provide more perfect counteraction of these photo-currents, this auxiliary semiconductor junction, operated in reverse-bias, is matched in characteristics with the collector-base junction of the amplifier transistor, and the base-to-collector potential of the amplifier transistor is arranged to be substantially the same as the reverse-bias potential across the auxiliary semiconductor junction.

16 Claims, 5 Drawing Figures

RADIATION-HARDENED TRANSISTOR AMPLIFIERS

The Government has rights in this invention pursuant to PO#037 - C90014 under contract N00030-74-C0100 awarded by the Department of the Navy.

The present invention relates to radiation-hardened transistor circuitry in which the transient photocurrents generated in the reverse-biased collector-base currents generated in the reverse-biased collector-base junction of a transistor responsive to transient ionizing (e.g. gamma) radiation are counteracted by the transient photo-currents generated in an auxiliary p-n junction exposed to the same radiation, which circuitry is particularly well-suited for monolithic integration.

J. W. Crowe in U.S. Pat. No. 3,409,839 issued Nov. 5, 1968, and entitled "Method and Apparatus for Minimizing the Effects of Ionizing Radiation on Semiconductor Circuits" describes the generation of photo-current flow in the collector-base junction of an amplifier transistor, which current flows in the direction of difficult conduction tending to increase charge on the base-emitter junction of the amplifier transistor, increasing its emitter-to-base potential, its base current, and consequently its collector current flow. To forestall this increase in emitter-to-base potential and thus prevent transient disturbances in collector current flow caused by ionizing radiation, Crowe applies a neutralizing charge to the base electrode of the amplifier transistor from the collector electrode of a transistor with no connection to its emitter electrode, which open-emitter transistor is exposed to the same ionizing radiation as the amplifier transistor. Crowe mentions that the base potential of the open-emitter transistor can be adjusted to an optimum value to further improve the cancellation of the charge variations generated in the collector-to-base junctions of the amplifier and open-emitter transistors if desired. Also if interest is the teaching with regard to differential transistor amplifiers which are generally insensitive to the presence of radiation fields offered by R. A. Stehlin and H. W. Spence in U.S. Pat. No. 3,716,727 issued Feb. 13, 1973, and entitled "Switched Amplification System Having Radiation Compensation Circuitry".

In monolithic integrated circuits, it is desirable to avoid, insofar as possible, the use of adjustments. In part, this is a desire to avoid the handling of the circuits on a per unit basis that attends individual adjustment of the circuits. But also, the adjustable elements that are normally used, such as potentiometers, are non-integrable. So one has to accept the inconvenience of providing connections between the integrated circuit and external components and the problems of reliability associated with such connections. Also, one must maintain inventories of separately manufactured parts in order to assemble complete circuits. Substantial production costs are associated with these disadvantages.

Monolithic integrated circuits have the advantage that circuit components that are concurrently made by the same series of processing steps and have similar dimensions can be made to have closely similar operating characteristics. The present invention makes use of this by arranging for the simultaneous fabrication of the collector-base junction of an amplifier transistor and auxiliary junction of similar profile and area subsequently connected between the base electrode of the amplifier transistor and another point—e.g., the emitter electrode of the amplifier transistor—which is at a potential that reverse-biases the auxiliary junction. Provision is made for maintaining the base-to-collector voltage of the amplifier transistor substantially equal to the reverse potential across the auxiliary junction, this being done either directly or indirectly. This is for conditioning the collector-base junction of the amplifier transistor and the auxiliary junction to show similar photo-current responses to similar ionizing radiation conditions. Transient ionizing radiation impingent upon the collector-base junction of the amplifier transistor also impinges upon the auxiliary junction; and similar photo-currents are generated in the two junctions, particularly if the junctions are adjacent to each other on the monolithic integrated circuit die. The flow of photo-currents generated in the collector-base junction of the amplifier transistor responsive to transient ionizing radiation is met at the base electrode of the amplifier transistor by a countervailing flow of photo-currents generated in the auxiliary junction responsive to the transient ionizing radiation, with no net photo-current flow to effect change at the base electrode of the amplifier transistor and thus alter the base current or voltage conditions. So the photo-currents generated in the collector-base junction of the amplifier transistor are not amplified to appear in the collector or emitter currents of the amplifier transistor. Good neutralization of the effects of transient photo-current upon the conditions at the base electrode of the amplifier transistor is obtained without need for external components for adjustment.

Figure 2:
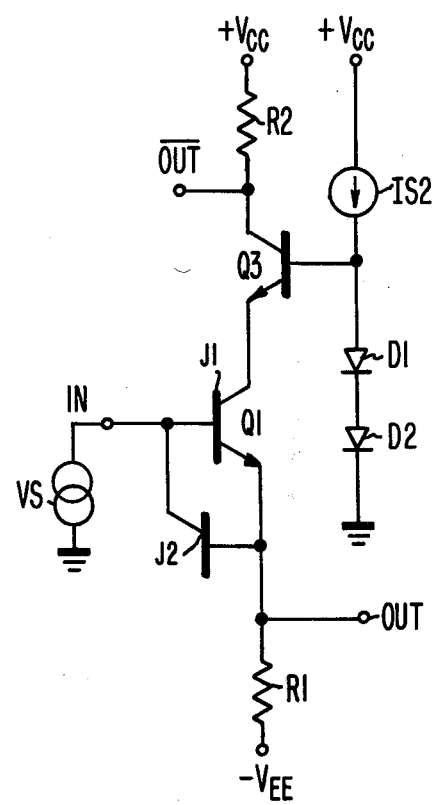
Figure 3:
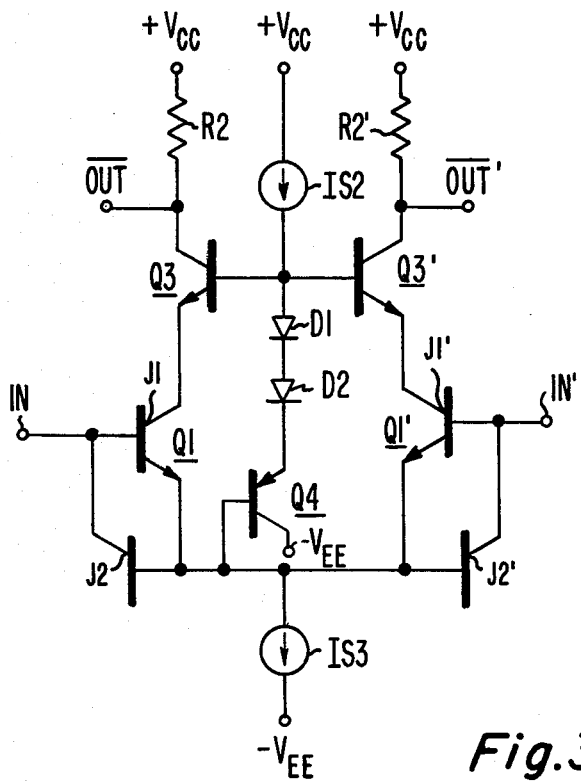
Figure 4:
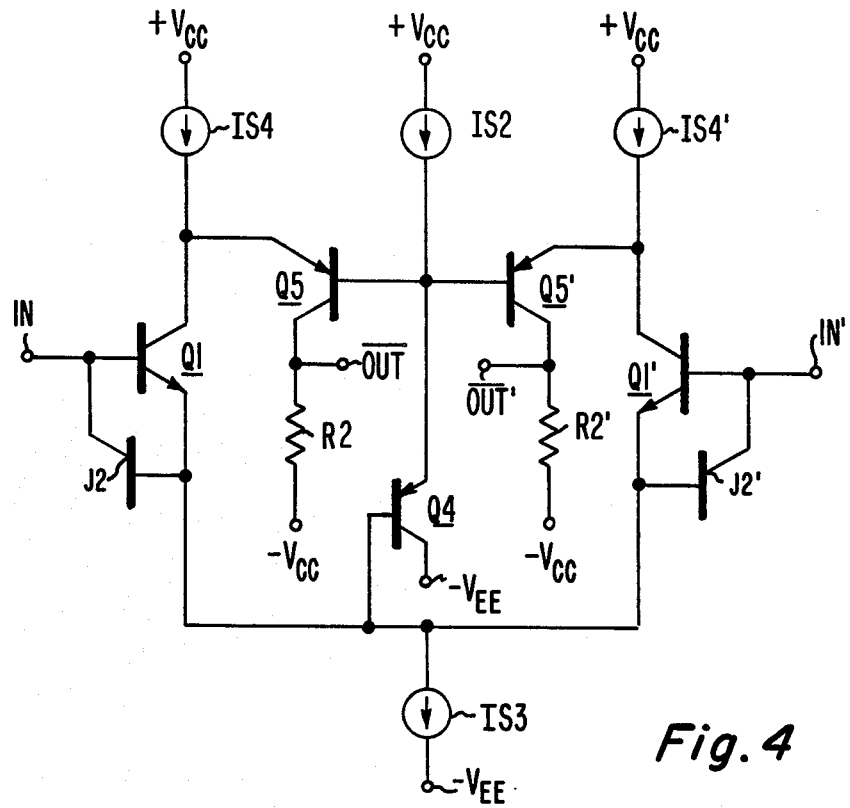
Figure 5:
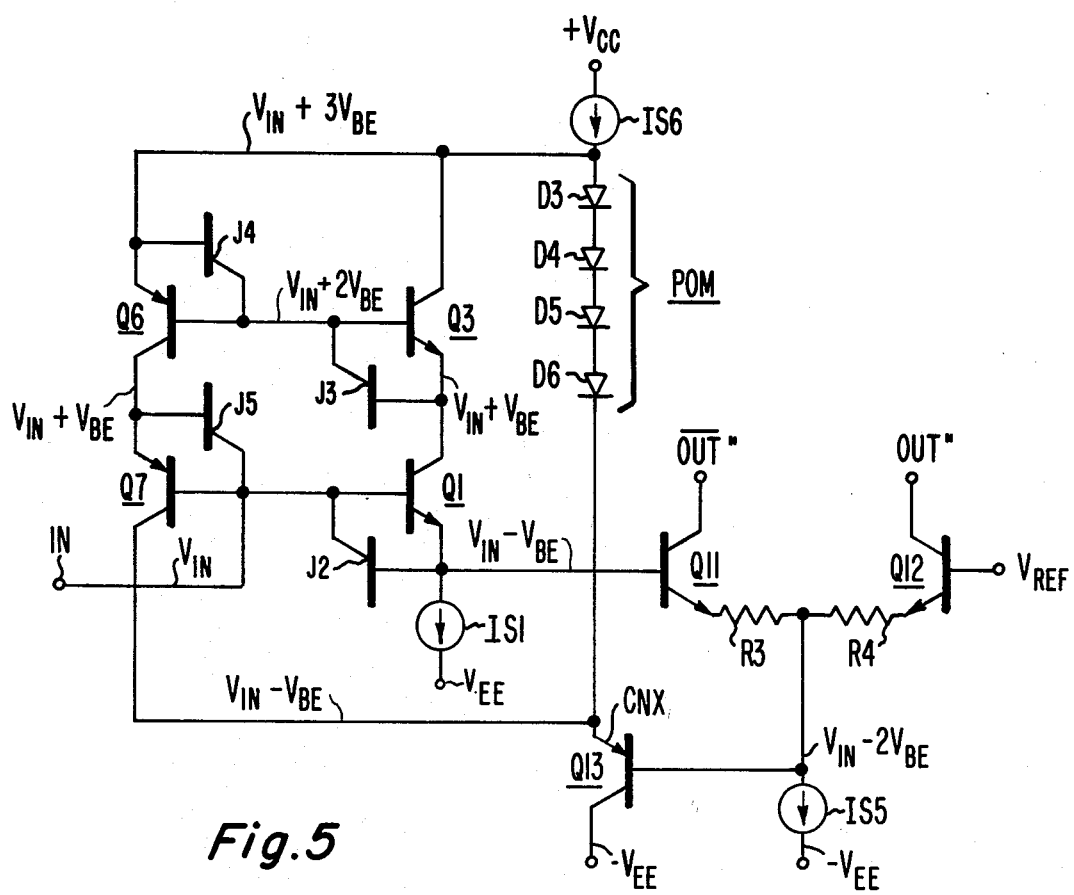

In the drawing:

FIG. 1 is a schematic diagram partially in block form of an emitter-follower transistor arranged in accordance with the present invention so its operating characteristics are substantially unaffected by ionizing radiation impingent upon it, FIG. 2 is a schematic diagram of a transistor arranged in accordance with the present invention so its operating characteristics as common-collector or common-emitter amplifier are substantially unaffected by ionizing radiation impingent upon it, each of FIGS. 3 and 4 is a schematic diagram of transistors in long-tailed pair configuration arranged according to the present invention to be substantially unaffected by ionizing radiation impingent upon them, and FIG. 5 is a schematic diagram of a buffer stage used for driving a long-tailed pair amplifier, which buffer stage includes an emitter-follower transistor connected per FIG. 1, which specific connection provides base current cancellation for the emitter follower transistor.

In FIG. 1, transistor Q1 is in emitter-follower connection with a signal input terminal IN connected to its base electrode and a signal output terminal OUT to which its emitter electrode connects. Means—e.g., a constant current generator, IS1—are connected to the emitter electrode of Q1 to determine its emitter current level in accordance with known circuit design principles; and responsive to the flow of this emitter current an emitter-to-base potential $V_{BEQ1}$ appears between the emitter and base electrode of Q1. Transistor Q2 is included together with Q1 in a monolithic integrated circuit structure, being concurrently formed with Q1 by the same processing steps and having a collector-base junction J2 of the same profile and area as the collector-base junction J1 of Q1; and Q1 and Q2 are arranged to receive similar ionizing radiation. Q2 is shown with no connection to its emitter electrode, and its collector electrode is connected to the base electrode of Q1 to supply neutralizing charge thereto during bombardment of Q1 and Q2 by transient ionizing radiation. Operation despite bombardment by transient gamma radiation in the range of $10^6$ to $10^8$ rads/second is usually sought, and transient photo-currents of around 10 to 40 microamperes may be expected with transistors of types designed to conduct currents of the order of 0.1 to 1 milliampere, although exact measurements of transient ionizing radiation effects are difficult to make. Photo-currents increase roughly linearly with the reverse-bias on the collector-base junction over a 0–40 volt range, increasing about 1½ times over that range.

In practice J2 is often a simple auxiliary p-n junction made concurrently with and similar to J1, which auxiliary junction has no emitter region, emitter-base junction, or emitter electrode associated therewith. Such simplified structure is symbolized by a transistor symbol without emitter arrow in FIGS. 2-4.

The base electrode of Q2 is referred in potential to the emitter potential of Q1; FIG. 1 shows this being done by direct connection between the emitter electrode of Q1 and the base electrode of Q2. This connection together with the connection between the collector of Q2 and base of Q1 define the offset potential $V_{J2}$ across the collector-base junction of Q2. When these connections are direct connections without substantial intervening offset or impedance, $V_{J2} = V_{BEQ1}$. Q1 is constrained to have a base-to-collector potential $V_{CBQ1}$ which is substantially equal to $V_{J2}$, so that the photo-current generated at the collector electrode of Q2 during bombardment of Q1 and Q2 by transient ionization radiation is most likely to be of such amplitude as to exactly counteract the photo-current generated at the base electrode of Q1. This constraint may be exercised indirectly as shown in FIG. 1 by using a regulator means VR for regulating the emitter-to-collector potential $V_{CEQ1}$ of Q1 to a value substantially equal to $V_{J2} + V_{BEQ1}$, which value in the FIG. 1 configuration will specifically be equal to twice $V_{BEQ1}$.

FIG. 2 shows the base-to-collector potential $V_{CB1}$ of Q1 being more directly constrained substantially to equal $V_{J2}$, which again is equal to $V_{BEQ1}$ by reason of auxillary junction J2 being connected in inverse-parallel with the emitter base junction of Q1. A source of input signal voltage VS connected to the base electrode of Q1 via input signal terminal IN applies a zero quiescent base voltage, as referred to ground, to Q1. Current source IS2 supplied forward bias current to the series connection of diodes D1, D2 to bias the base electrode of transistor Q3 to a potential which is equal to twice the offset potential across a forward-biased semiconductor junction and is positive, as referred to ground. The emitter-follower action of Q3 places its emitter potential closer to ground by its emitter-to-base offset potential $V_{BEQ3}$, so the collector electrode of Q1 is at a potential which is positive respective to ground and its quiescent base potential by an amount substantially equal to the potential offset across a single forward-biased semiconductor junction. That is, $V_{CB1}$ is substantially equal to the $V_{BEQ1}$ potential across auxiliary junction J2.

Q1 has its quiescent emitter current determined according to Chin's Law by the potential difference appearing across resistive element R1 in its emitter circuit, R1 being connected at one of its ends to the emitter electrode of Q1 to receive a quiescent potential of $V_{BEQ1}$ and being connected at the other of its ends to a point of negative operating potential $V_{EE}$. Q1 may be operated as an emitter-follower, taking response to the input signal voltage applied from source $V_S$ from an output terminal OUT connected to the emitter electrode of Q1. If operation of Q1 only as an emitter-follower is sought, the collector of Q3 may be connected to a point of positive operating potential $+V_{CC}$ directly without substantial intervening resistance, rather than through a resistive element R2 as shown in FIG. 2. R1 may be replaced by a current source such as provided by the collector-to-emitter circuit of a transistor with fixed base-to-emitter bias current.

Alternatively, the FIG. 2 configuration may be operated as a voltage amplifier, operating Q1 and Q3 as a cascode, with R2 providing Q3 a collector load across which an output signal voltage substantially R2/R1 times the input signal voltage from source VS is developed and made available at output terminal $\overline{OUT}$. The demand for photo-current by junction J2 when it is exposed to transient ionizing radiation will divert current from the base-emitter junction of Q1, tending to lower the collector current of Q1 by the same decrement as the emitter current of Q1 is reduced by the current diverted through J2. This tendency is essentially perfectly compensated for by the photo-current generated in the collector-base junction J1 of Q1 augmenting the other component of the collector current of Q1 due to amplified base current. While the collector current of Q1 is essentially unaffected by transient ionizing radiation insofar as its effects on Q1 and J2 are concerned, the photo-currents generated in the reverse-biased collector-base junction of Q3 will cause variations in the potential drop across R2 and thus in the output signal voltage at the $\overline{OUT}$ terminal. The photo-current variations are not amplified by the common emitter forward current gain, or $h_{fe}$, of any transistor; they may be largely compensated for, if desired, by connection of a reverse-biased further auxiliary junction (not shown) across R2. Also, one should take steps in accordance with normal practice to make allowance for transient photo-currents generated in R1 and R2 responsive to transient ionizing radiation impinging upon them.

FIG. 3 shows how the interconnection of a pair of the FIG. 2 circuits at their OUT terminals may be used as a differential amplifier, with long-tailed pair operation of their respective signal-amplifying transistors Q1 and Q1'. The junction J2' is connected in inverse-parallel with the emitter-base junction of Q1' to provide compensation for photo-current induced in the collector-base junction J1' of Q1' whenever Q1' and Q2' are exposed to transient ionizing radiation. A current source IS3, which in practice is usually the constant current generator provided at the collector of a further transistor (not shown) with fixed emitter-to-base bias and of the same conductivity type as Q1 and Q1', withdraws tail current from the interconnection between the emitters of Q1 and Q1'. Q1' is provided an input IN' at its base electrode, and its collector is connected to the emitter electrode of a transistor Q3' having a collector connected to a terminal $\overline{OUT}'$ and connected to $+V_{cc}$ operating potential via resistive element R2'. Q3' and Q1' are thus in cascode arrangement with each other. Q3 and Q3' may, as shown, advantageously share the same means for establishing a potential offset voltage between the interconnection of their base electrodes and the interconnection of the emitter electrodes of Q1 and Q1'.

Q4 may be replaced in the FIG. 3 configuration with still another forward-biased diode in series connection with D1 and D2, between the base of Q3 and the emitter of Q1. Or as another alternative, where zero-voltage common-mode components are anticipated in the signals applied to terminals IN and IN' the series connection of forward-biased diodes D1 and D2 may be between ground and the interconnection of the gate electrodes of Q3 and Q3'.

An advantage of differential amplifier operation is that the transient photo-currents generated in the collector-base junction of Q3, Q3' cause common-mode variations in the output signal voltages of $\overline{OUT}$ and $\overline{OUT}'$ terminals. Response to these common-mode variations can be suppressed in an ensuing differential amplifier stage (not shown).

As shown in FIG. 4 long-tailed transistors Q1 and Q1' may be operated in "folded-cascode" configuration with transistors Q5 and Q5', respectively, of a conductivity type complementary to that of Q1 and Q1' replacing Q3 and Q3' respectively, of FIG. 3. The interconnection between the base electrodes of Q5 and Q5' are directly connected to the emitter electrode of emitter-follower transistor Q4, and the collector load resistances of Q5 and Q5' afforded by R2 and R2' connect their collector electrodes to a negative operating potential $-V_{EE}$. A current source IS4 supplied the combined Q1 collector current and Q5 emitter current requirements IS4 may be provided by a PNP transistor connected at its collector electrode to the interconnection of the Q1 collector electrode and Q5 emitter electrode, and arranged with emitter-to-base biasing to condition it to supply constant collector current. IS4 may however simply comprise a resistance connecting Q1 collector and Q5 emitter to a remote $+V_{CC}$ voltage supply. IS4', similar to IS4 supplies the combined Q1' collector current and Q5' emitter current analogously to IS4 supplying the combined Q1 collector current and Q5 emitter current.

FIG. 5 shows how arrangements for cancelling the base current of transistor Q1, here connected as an emitter follower, can be modified to embody the present invention. The manner in which NPN transistor and PNP transistors Q3, Q6 and Q7 cooperate to cancel the base current of NPN transistor Q1 is known from U.S. Pat. No, 3,551,832 issued Dec. 29, 1970, to J. G. Graeme and entitled "Transistor Base Current Compensation System". Transistors, Q1, Q3, Q6 and Q7 are connected in positive feedback loop and have, in inverse-parallel connection with their respective collector-base junctions, the reverse-biased junction J2, J3, J4 and J5 respectively, that compensate them for transient photocurrent. The positive feedback connection makes it necessary to compensate each of Q1, Q3, Q6 and Q7 for transient photo-currents, so that Q1 will not couple such currents to the base electrode of transistor Q11.

Q11 is connected in long-tailed pair configuration with transistor Q11, the base electrode of which is connected to a reference potential $V_{REF}$. The long-tailed pair configuration is shown as including a current source IS5 connected to withdraw tail current from the interconnection of the emitter resistors R3 and R4 of Q11 and Q12. R3 and R4 provide degenerative current feedback to Q11 and Q12 respectively and are assumed to be of suffient low resistance that negligibly small potential drops appear across them attributable to their conduction of their respective portions of the tail current. The collectors of Q11 and Q12 are connected to terminals $\overline{OUT}''$ and OUT'', respectively, which when properly connected in accordance with well-known techniques furnish push-pull responses to variations in the difference between $V_{REF}$ and the emitter potential $V_{EQ1}$ of Q1. $V_{EQ1}$ is, of course, more negative by $V_{BEQ1}$ than the input signal variations in the quiescent potential $V_{IN}$ applied to terminal IN.

Of particular interest to the present invention is the manner in which the amplitudes of the respective emitter-to-collector potentials $V_{CEQ1}$, $V_{CEQ3}$, $V_{CEQ6}$ and $V_{CEQ7}$ of transistors Q1, Q3, Q6 and Q7 are maintained at $+2V_{BE}$ values as compared to the $1V_{BE}$ values the reverse-bias potentials across J2, J3, J4 and J5 have by reason of their inverse-parallel connections with the emitter-base junctions of Q1, Q3, Q6 and Q7 respectively.

By reason of the emitter-follower action of Q7 its emitter potential $V_{EQ7}$ has a value $V_{IN}+V_{BE}$, more positive by $1V_{BE}$ than its base potential $V_{BQ7}=V_{IN}$.

By reason of the emitter follower actions of Q1 and Q11, respectively, the emitter potential $V_{EQ1}$ of Q1 is $1V_{BE}$ more negative than $V_{IN}$ and the emitter potential $V_{EQ11}$ of Q11 is $1V_{BE}$ still further negative respective to $V_{IN}$. $V_{REF}$ is arranged to be equal to the quiescent value of $V_{EQ1}$; and so the emitter potential $V_{EQ12}$, as well as $V_{EQ11}$, is $2V_{BE}$ more negative than $V_{IN}$. Assuming the potential drops across R3 and R4 to be negligible, the potential at their interconnections is $2V_{BE}$ more negative than $V_{IN}$. The potential $V_{IN}-2V_{BE}$ at this interconnection is applied to the base electrode of PNP transistor Q13, Q13 is arranged as an emitter follower with current source IS6 supplying forward bias to its emitter-base junction after providing forward bias to diodes D3, D4, D5, and D6 in series connection to provide a potential offsetting means POM between the emitters of Q13 and Q6. By reason of the emitter-follower action of Q12 the emitter potential $V_{EQ13}$ of Q12 is $1V_{BE}$ more positive than $V_{BQ13}$ and so substantially $1V_{BE}$ more negative than $V_{IN}$.

Potential offset means POM maintains the emitter potential $V_{EQ6}$ of Q6 more positive than $V_{EQ13}$ by 4 $V_{BE}$, assuming the offset potential across each of the diodes D3, D4, D5 and D6 to be substantially the same as that across the emitter-base junction of a transistor. This is easily arranged, the most straighforward way being to use the emitter-to-collector paths of transistors, each self-biased by direct connection if its collector and base electrodes, for the diodes. $V_{EQ6}$ is thus $3V_{BE}$ more positive than $V_{IN}$. The potential-clamping action of the emitter-base junction of Q6 establishes the base potentials of Q6 and Q3 at a potential only $2V_{BE}$ more positive than $V_{IN}$, and the emitter-follower action of Q3 maintains its emitter potential $V_{EQ3}$ and thus the collector potential of Q1 at a value only $1V_{BE}$ more positive than $V_{IN}$.

Accordingly, Q11, R3, Q13, POM, Q6 and Q3 cooperate to regulate $V_{CEQ1}$ to $2V_{BE}$ amplitude. $V_{CEQ3}$ is regulated to $2V_{BE}$ amplitude by the potential-clamping action of the forward-biased emitter-base junction of Q6 and of Q3 itself. $V_{CEQ6}$ is regulated to $2V_{BE}$ amplitude by the emitter-follower action of Q1, in cooperation with potential-offsetting action of the combination comprising Q11, R3, Q13, POM and by the emitter-follower action of Q7. $V_{CEQ7}$ is maintained at $2V_{BE}$ amplitude by its own emitter-follower action and by the combined emitter-follower actions of Q1, Q11, and Q13.

If, contrary to prior assumption, there are potential drops of appreciable magnitude across resistive elements R3 and R4, a compensating potential drop can be provided by using a proper value resistance in the connection CNX of the emitter electrode of Q13 to POM and the collector of Q7, provided that the current supplied by IS6 is maintained in constant ratio to the current demanded by IS5.

The FIG. 5 configuration may be modified to include a further diode connected in the forward direction between the current generator IS1 and the node at the emitter electrode of Q1, the $V_{IN}$-$V_{BE}$ voltage being applied to its anode to cause a $V_{IN}$-$2V_{BE}$ potential at its cathode which may be applied to the base electrode of Q13. The connection of the base electrode of Q13 to the interconnection of R3 and R4 is then dispensed with. This alternative construction permits the emitter electrode of Q1 to drive configurations other than a long-tailed pair.

The FIG. 5 configuration may be modified in its construction to include a first potential offsetting means between the Q6 collector and the interconnection of the Q7 emitter and J5 cathode and a second similar potential offsetting means between the Q1 collector and the interconnection of the Q3 emitter and J3 anode. If so, POM should include a third similar potential offsetting means in series with diodes D3, D4, D5, and D6. Analogously, in FIG. 2 the inclusion of potential offsetting means between the Q1 collector and Q3 emitter calls for inclusion of a similar potential offsetting means in series with D1 and D2 between Q3 base and ground. In FIG. 3 similar potential offsetting means may be included between Q1 collector and Q3 emitter, Q1' collector and Q3' emitter and in series with D1.

What is claimed is:

1. Radiation-hardened transistor circuitry comprising:
    a first transistor having base, emitter and collector electrodes and having emitter-base and collector-base junctions;
    a first auxiliary semiconductor junction constructed integrally with said first transistor to be subject to the same transient ionizing radiation as the collector-base junction of said first transistor and to have profile and area similar to those of the collector-base junction of said first transistor;
    means connecting said first auxiliary semiconductor junction in inverse-parallel with the emitter-base junction of said first transistor for placing a reverse-bias potential across said first auxiliary semiconductor junction; and
    means biasing said first transistor for normal operation, which means includes means for constraining the base-to-collector potential of said first transistor to be substantially equal to said reverse-bias potential.

2. Radiation-hardened transistor circuitry as set forth in claim 1 wherein means are included for applying an input signal potential with prescribed quiescent value to the base electrode of said first transistor thereby to cause an emitter-to-base offset potential across the emitter-base junction of said first transistor, wherein means are included for obtaining an output signal potential from an electrode of said first transistor other than its base electrode, and wherein said means for constraining the base-collector potential of said first transistor to be substantially equal to the reverse-bias potential across the first auxiliary semiconductor junction comprises means for regulating the emitter-to-collector potential of said first transistor substantially to equal the sum of the emitter-to-base offset potential of said first transistor plus the reverse-bias potential across said first auxiliary semiconductor junction.

3. Radiation-hradened transistor circuitry as set forth in claim 1 wherein means are included for applying an input signal potential to the base electrode of said first transistor, wherein means are included for obtaining an output signal from an electrode of said first transistor other than its base electrode, and wherein said means for constraining the base-to-collector potential of said first transistor to be substantially equal to the reverse-bias potential across said first auxiliary semiconductor junction comprises means for regulating the potential between a point of reference potential, against which said input signal potential may be referred, and the collector electrode of said first transistor.

4. Radiation-hardened transistor circuitry as set forth in claim 3 wherein said means for regulating the potential between a point of reference potential and the collector electrode of said first transistor includes:
    a second transistor of similar conductivity type to said first transistor having an emitter electrode connected to the collector electrode of said first transistor, having a collector electrode connected to condition said second transistor for exhibiting emitter-follower action between its base and emitter electrodes, and having a base electrode, and
    means for regulating to potential at the base electrode of said second transistor to a value differing in fixed amount from the quiescent value of said input signal potential.

5. Radiation hardened transistor circuitry as set forth in claim 4 wherein the collector electrode of said first transistor directly connects without substantial intervening offset potential to the emitter electrode of said second transistor and wherein said fixed amount is substantially equal to twice the offset voltage across a forward-biased semiconductor junction.

6. Radiation-hardened transistor circuitry as set forth in claim 4, wherein said means for obtaining an output signal potential from an electrode of said first transistor other than its base electrode also includes said second transistor and means for operating said second transistor in cascode configuration with said first transistor.

7. Radiation-hardened transistor circuitry as set forth in claim 3 wherein said means for regulating the potential between a point of reference potential and the collector electrode of said first transistor includes:
    a second transistor of similar conductivity type to said first transistor having an emitter electrode connected to the collector electrode of said first transistor, having its collector electrode connected to condition said second transistor for exhibiting emitter-follower action between its base and emitter electrodes, and having a base electrode; and
    means for regulating the potential between the emitter electrode of said first transistor and the base electrode of said second transistor to a fixed value.

8. Radiation-hardened transistor circuitry as set forth in claim 7 wherein the collector electrode of said first transistor directly connects without substantial intervening offset potential to the emitter electrode of said second transistor and wherein said fixed value is substantially three times as large as the offset voltage across a forward-biased semiconductor junction.

9. Radiation-hardened transistor circuitry as set forth in claim 7 wherein said means for obtaining an output signal potential from an electrode of said first transistor other than its base electrode also includes said second transistor and means for operating said second transistor in cascode configuration with said first transistor.

10. Radiation-hardened transistor circuitry as set forth in claim 3 wherein said means for regulating the potential between a point of reference and the collector electrode of said first transistor includes:
   a second transistor of opposite conductivity type to said first transistor having base and emitter electrodes and having a collector electrode connected to condition said second transistor for exhibiting emitter-follower action between its base and emitter electrodes;
   means for regulating the potential at the base electrode of said second transistor to a fixed potential respective to the quiescent value of said input signal potential.

11. Radiation-hardened transistor circuitry as set forth in claim 10 wherein the collector electrode of said first transistor connects without substantial intervening offset potential to the emitter electrode of said second transistor and wherein said fixed potential substantially equals the quiescent value of said input signal potential.

12. Radiation-hardened transistor circuitry as set forth in claim 10 wherein said means for obtaining an output signal potential from an electrode of said first transistor other than its base electrode also includes said second transistor and means for operating said second transistor in folded-cascode configuration with said first transistor.

13. Radiation-hardened transistor circuitry comprising:
   first, second, third and fourth transistors of a first conductivity type, each of said transistors having base and emitter and collector electrodes,
   means connecting said first and second transistors in long-tailed pair configuration, including
   means for applying an input signal between the base electrodes of said first and second transistors, and including
   a source of tail current connected to an interconnection between the emitter electrodes of said first and second transistors;
   a first auxiliary semiconductor junction constructed integrally with said first transistor to be subject to the same transient ionizing radiation as the collector-base junction of said first transistor and to have profile and area similar to those of the collector-base junction of said first transistor;
   a second auxiliary semiconductor junction constructed integrally with said second transistor to be subject to the same transient ionizing radiation as the collector-base junction of said second transistor and to have profile and area similar to those of the collector-base junction of said first transistor;
   means connecting said first auxiliary semiconductor junction in inverse-parallel with the emitter-base junction of said first transistor and
   means connecting said second auxiliary semiconductor junction in inverse-parallel with the emitter-base junction of said second transistor for placing similar reverse-bias potentials across said first and second auxiliary semiconductor junctions;
   a source of first bias current connected to an interconnection between the collector electrode of said first transistor and the emitter electrode of said third transistor for conditioning said first and third transistors to operate in folded-coscode configuration with each other;
   a source of second bias current connected to an interconnection between the collector electrode of said second transistor and the emitter electrode of said fourth transistor for conditioning said second and fourth transistors to operate in folded-coscode configuration with each other;
   means for applying collector potentials to the collector electrodes of said third and fourth transistors for conditioning each of them to exhibit emitter-follower action between its base and emitter electrodes;
   means for extracting an output signal from at least one of the collector electrodes of said third and fourth transistors, and
   means for applying a regulated potential between the interconnection between the emitter electrodes of said first and second transistors and each of the base electrodes of said third and fourth transistors of such value as to constrain the base-to-collector potentials of said first and second transistors to be substantially equal to said reverse-bias potentials.

14. Radiation-hardened transistor circuitry comprising:
   first and second transistors of a first conductivity type and third and fourth transistors of a second conductivity type complementary to said first conductivity type, each of said transistors having base and emitter and collector electrodes and having collector-base and emitter-base junctions;
   a first auxiliary semiconductor junction, constructed integrally with said first transistor to be subject to the same transient ionizing radiation as the collector-base junction of said first transistor and to have profile and area similar to those of the collector-base junction of said first transistor, and connected in inverse parallel with the emitter-base junction of said first transistor for receiving a respective reverse-bias potential;
   a second auxiliary semiconductor junction, constructed integrally with said second transistor to be subject to the same transient ionizing radiation as the collector-base junction of said second transistor and to have profile and area similar to those of the collector-base junction of said second transistor, and connected in inverse parallel with the emitter-base junction of said second transistor for receiving a respective reverse-bias potential;
   a third auxiliary semiconductor junction, constructed integrally with said third transistor to be subject to the same transient ionizing radiation as the collector-base junction of said third transistor and to have profile and area similar to those of the collector-base junction of said third transistor, and connected in inverse parallel with the emitter-base junction of said third transistor for receiving a respective reverse-bias potential;
   a fourth auxiliary semiconductor junction, constructed integrally with said fourth transistor to be subject to the same transient ionizing radiation as the collector-base junction of said fourth transistor and to have profile and area similar to those of the collector-base junction of said fourth transistor, and connected in inverse parallel with the emitter-base junction of said fourth transistor for receiving a respective reverse-bias potential;
   an input terminal connected to the base electrode of said first transistor, for applying an input signal to cause response thereto at one of the electrodes of said first transistor other than its base electrode; and means for constraining the base-to-collector potentials of each of said first and second and third transistors to be substantially equal to the reverse-bias potential across the auxiliary junction in inverse-parallel connection with its emitter-base junction, which means includes:

means connecting the collector electrode of said first transistor to the emitter electrode of said second transistor for conditioning said second transistor for base current substantially equal to that of said first transistor, means connecting the base electrode of said second transistor to the base electrode of said third transistor for conditioning said third transistor for base current substantially equal to that of said second transistor and thus to that of said first transistor, means connecting the collector electrode of said third transistor to the emitter electrode of said fourth transistor for conditioning said fourth transistor for base current substantially equal to that of said third transistor and thus to that of said first transistor, means connecting the base electrode of said fourth transistor to the base electrode of said first transistor for supplying the base current of said fourth transistor to the base electrode of said first transistor substantially to meet the base current demand of said first transistor and thus close a regenerative feedback loop for reducing the base current demand of said first transistor upon circuitry preceding said input terminal;

means for regulating the potentials between the emitter electrode of said first transistor and each of the following: the collector electrode of said second transistor, the emitter electrode of said third transistor, and the collector electrode of said fourth transistor.

15. Radiation-hardened transistor circuitry as set forth in claim 14 wherein said means connecting the collector electrode of said first transistor consists of a first direct connection without substantial intervening potential offset, wherein said means connecting the base electrode of said second transistor to the base electrode of said third transistor consists of a second direct connection without substantial intervening potential offset, wherein said means connecting the collector electrode of said third transistor to the emitter electrode of said fourth transistor consists of a third direct connection without substantial intervening potential offset, wherein said means connecting the base electrode of said fourth transistor to the base electrode of said first transistor consists of a fourth direct connection without substantial intervening potential offset, and wherein said means for regulating comprises:

means for maintaining the collector potential of said second transistor substantially equal to the emitter potential of said third transistor, means for maintaining a difference in potential between the emitter electrodes of said first and third transistors which is substantially four times the offset potential across a forward biased semiconductor junction, and means for maintaining the collector potential of said fourth transistor substantially equal to the emitter potential of said first transistor.

16. Transistor circuitry including:

a transistor having base and emitter and collector electrodes, having an emitter-base junction between its emitter and base electrodes, and having a collector-base junction between its collector and base electrodes;

means for applying forward current to the emitter-base junction of said transistor, responsive to which an emitter-to-base potential appears across the emitter-base junction of said transistor;

means for maintaining the quiescent emitter-to-collector potential of said transistor essentially twice its quiescent emitter-to-base potential, responsive to which said collector-base junction is subject to conducting an undesirable reverse current;

an auxiliary semiconductor junction of the same profile and area as the collector-base junction of said transistor, said auxiliary semiconductor junction being integrally constructed with said transistor;

means connecting said auxiliary semiconductor junction in inverse-parallel connection with the emitter-base junction of said transistor, said auxiliary semiconductor thereby being subject to conducting a reverse current essentially equal to that of the collector-base junction of said transistor for preventing said undesirable reverse current conducted by the collector-base junction of said transistor from augmenting the forward current applied to the emitter-base junction of said transistor by said means for applying forward current to the emitter-base junction of said transistor.

* * * * *